(12) United States Patent
Downing et al.

(10) Patent No.: US 7,463,494 B2
(45) Date of Patent: Dec. 9, 2008

(54) SYSTEM FOR INSERTION AND EXTRACTION OF A PRINTED CIRCUIT BOARD MODULE INTO AND OUT OF A SUBRACK

(75) Inventors: Robert W. Downing, Tucson, AZ (US); Frank Hom, San Diego, CA (US); Stuart M. Scriven, Escondido, CA (US); Thomas M. Perazzo, Bolana Beach, CA (US)

(73) Assignee: PEP West, Inc., Golden Valley, MN (US)

( * ) Notice: Subject to any disclaimer, the term of this patent is extended or adjusted under 35 U.S.C. 154(b) by 66 days.

(21) Appl. No.: 10/502,131

(22) PCT Filed: Jan. 21, 2003

(86) PCT No.: PCT/US03/01773

§ 371 (c)(1),
(2), (4) Date: Mar. 30, 2005

(87) PCT Pub. No.: WO03/063560

PCT Pub. Date: Jul. 31, 2003

(65) Prior Publication Data

US 2005/0174743 A1 Aug. 11, 2005

Related U.S. Application Data

(60) Provisional application No. 60/350,415, filed on Jan. 21, 2002.

(51) Int. Cl.
H05K 7/12 (2006.01)

(52) U.S. Cl. ............... 361/798; 361/740; 361/759; 361/801; 361/747; 361/732

(58) Field of Classification Search ............... 361/759, 361/798, 801, 726, 732, 740, 747, 754; 312/223.2, 312/223.3
See application file for complete search history.

(56) References Cited

U.S. PATENT DOCUMENTS 4,413,399 A * 11/1983 Crawford et al. ............... 29/428

(Continued)

OTHER PUBLICATIONS

International Search Report for PCT/US03/01773, under date of mailing of Nov. 12, 2004.

*Primary Examiner*—Dean A. Reichard
*Assistant Examiner*—Dameon E Levi
(74) *Attorney, Agent, or Firm*—Green Traurig, LLP

(57) ABSTRACT

A system for inserting and extracting a plug-in module into and from an electronic equipment subrack is disclosed. In certain embodiments, the system includes an actuation device, an arm including a first guiding surface, and a second guiding surface on the module. At least a portion of the actuation device is located proximate a front edge of the module, while the arm is located proximate a rear edge of the module along which connectors are positioned. As the actuation device is moved in one direction, the arm is forced toward the module, causing the guiding surfaces to interact so that the arm engages a retaining component on the subrack. Opposite movement of the actuation device causes the arm to push away and disengage from the module. The actuation device in certain embodiments includes a lever and a drag link, or a push-pull rod coupled to a drag link.

16 Claims, 5 Drawing Sheets

U.S. PATENT DOCUMENTS

| | | | |
|---|---|---|---|
| 4,914,550 A | 4/1990 | Filsinger et al. | 361/386 |
| 5,518,412 A | 5/1996 | Larabell | 439/157 |
| 5,691,859 A * | 11/1997 | Ulrich et al. | 360/92.1 |
| 6,252,514 B1 * | 6/2001 | Nolan et al. | 340/686.4 |
| 6,266,248 B1 | 7/2001 | Hanas et al. | 361/752 |
| 6,406,312 B1 * | 6/2002 | Heitkamp | 439/160 |
| 6,408,312 B1 * | 6/2002 | Forthman et al. | 707/203 |
| 6,424,111 B1 * | 7/2002 | Romig | 318/568.21 |
| 6,975,519 B2 * | 12/2005 | Siahpolo et al. | 361/798 |
| 7,027,309 B2 * | 4/2006 | Franz et al. | 361/798 |

* cited by examiner

SYSTEM FOR INSERTION AND EXTRACTION OF A PRINTED CIRCUIT BOARD MODULE INTO AND OUT OF A SUBRACK

CROSS-REFERENCE TO RELATED APPLICATIONS

This application claims the benefit of U.S. provisional patent application No. 60/350,415, which was filed on Jan. 21, 2002.

FIELD OF THE INVENTION

The present invention relates generally to electronic equipment racks and related systems, including subracks and plug-in modules with one or more printed circuit boards for insertion and removal from the subracks. More specifically, the present invention relates to systems by which the plug-in modules are inserted and extracted from the subracks.

BACKGROUND OF THE INVENTION

Electronic equipment subracks are commonly employed in computers, data processing and communication systems, and other devices. The subracks often are positioned within and supported by racks, which are larger cabinets for the electronic equipment. Typically, to assemble and configure such subracks for use, plug-in modules must be appropriately inserted into the subracks to establish desired electrical connections between the printed circuit boards of the plug-in modules and the backplane of the subracks. Once inserted, the plug-in modules should be secured or locked to the subracks in order to maintain the desired electrical connections. Also, in order to repair, maintain, reconfigure, upgrade or otherwise modify the electronic equipment subracks and/or the electronic components supported by those subracks, plug-in modules that were originally inserted into the subracks must be extracted or removed from the subracks.

Given the frequency with which these insertion and extraction processes must be performed in manufacturing, configuring, and modifying computers and other devices, systems and methods have been developed for performing these insertion and extraction processes and, in particular, for properly aligning and locking the plug-in modules into place during the insertion. Such conventional systems typically include mechanisms that are located at and operate upon the front edges of the plug-in modules opposite the respective connector edges of those modules. That is, in order to insert or extract a plug-in module with respect to a subrack, force is applied to an edge of the plug-in module that is opposite that of the edge having connectors which are to mate with complementary connectors of the subrack. Because the force is applied to the front edge of the plug-in module rather than to the connector edge that is actually in contact with (or intended to be in contact with) the connectors of the subrack, force is transferred through the plug-in module from its front edge to its connector edge, at which the contact forces between the connectors of the plug-in module and the subrack occur.

Similarly, the conventional insertion and extraction systems are generally located at and operate upon the front edges of the subracks into or from which the plug-in modules are being inserted or extracted. Thus, the forces applied to the subracks by these systems are not applied directly to the portions of the subracks (e.g., the backplane) where the connectors are located. Consequently, the forces applied to the subracks during insertion or extraction of the plug-in modules must be transferred by way of the walls or other structures of the subracks (or racks), particularly between the front edges of the subrack and the middle or rear of the subracks at which its connectors are positioned.

As the complexity and functionality of plug-in modules have increased in the past several years, the demands for connector capacity have increased, thereby increasing the number and density of the connectors on the subracks and plug-in modules. Because the increased number and density of the connectors produces increased gripping action of the connectors, and also because increased gripping action is desirable to improve the reliability of the electrical connections between connectors, the amount of gripping force occurring between plug-in modules and subracks can exceed hundreds of pounds of force. Such large forces due to both connectors and other mating components can be difficult to apply during insertion and extraction of plug-in modules, thus making it difficult to perform the addition, replacement or upgrading of plug-in modules in electronic equipment subracks/racks.

Further, the application of such large forces creates stresses on the plug-in modules, the printed circuit boards within the plug-in modules and the subracks supporting the plug-in modules. In particular, the forces and stresses exerted on the printed circuit boards can cause deformation of the printed circuit boards or cause components to dislodge from the boards. Further, the forces and stresses exerted on the subracks can cause deflection of the components of the subracks and even cause deformation of the backplane. Because of their impact upon the structural dimensions and other features of both the plug-in modules and the subracks, the insertion and extraction forces can prevent the connectors of the plug-in modules and the subracks or backplane from fully seating and produce unreliable connections.

U.S. Pat. No. 6,171,120 to Bolich et al. shows a connection mechanism for coupling a printed circuit board to a subrack in which an actuator handle at a front of the printed circuit board is coupled to a hook at a rear of the printed circuit board, by way of an arm that extends across the printed circuit board. While the arm operates to transfer some of the force applied to the actuator handle to the hook, the actuator handle is shown to be coupled not only to the arm but also directly to the printed circuit board. Consequently, some of the force applied to the actuator handle nevertheless is applied at the front edge of the plug-in module as well as to the hook, such that Bolich et al. does not fully address the above-described problems associated with the application of insertion and extraction forces.

Further, the hook shown in Bolich et al. is simply rotatably coupled to the printed circuit board such that the hook slides over an extension of the subrack. Consequently, the mechanism of Bolich et al. does not appear to operate so that the hook, after first coming into contact with the extension of the subrack, then grasps the extension to provide for strong retention of the printed circuit board. Conversely, it does not appear to be the case that when the mechanism of Bolich et al. is actuated to release the printed circuit board, any pressure is exerted by the hook (or any other component) tending to cause the printed circuit board to be forced apart from the subrack. Consequently, the mechanism of Bolich et al. does not appear to facilitate the application of strong forces upon the connectors of the printed circuit board and subrack that are necessary when the resistance to insertion and extraction of the printed circuit board due to those connectors is large, as discussed above.

It therefore would be advantageous if a new system for inserting and extracting plug-in modules from subracks was developed. In particular, it would be desirable if such a new system facilitated the application of the large forces necessary to insert and extract the plug-in modules. Additionally, it would be desirable if the new system allowed for the insertion and/or extraction of plug-in modules in a manner that did not require the transference of great forces across and through the plug-in modules (or the printed circuit boards within those modules), or across and through the subracks (or backplane). It further would be desirable if such a system was simple and cost-effective to employ, and also allowed for proper alignment of the plug-in modules during insertion of the plug-in modules.

SUMMARY OF THE INVENTION

The present inventors have recognized that it is possible for an insertion/extraction mechanism for a printed circuit board to include an actuator located at a front edge of the printed circuit board that, when actuated, directs all (or virtually all) of the applied force to a latching mechanism proximate a rear edge of the printed circuit board along which are connectors. In one embodiment, the actuator includes a push-pull rod that is operable from the front edge of the module while, in another embodiment, the actuator includes a lever that is operable from the front edge of the module.

The present inventors further have recognized that, to apply strong forces to achieve proper insertion and extraction of a printed circuit board, it would be desirable to employ a latching mechanism that was not only capable of rotating to hook onto (or to unhook from) a retaining component, but also was capable of moving translationally to apply greater retention and ejection forces with respect to the retaining component and/or backplane/subrack. Alternatively, such operation can be understood as including movement substantially along one axis (e.g., vertical movement) in order to hook onto or unhook from the retaining component, and also movement primarily along a different, substantially orthogonal, axis (e.g., horizontal movement) to apply pressure upon the retaining component or the backplane/subrack. Thus, in certain embodiments of the present invention, a latch mechanism includes an arm that has a specially-shaped surface that interfaces another surface on the printed circuit board. Due to the relative shapes of the surfaces of the arm and the printed circuit board, when the actuation device causes the arm to be translationally moved inward, the arm also rotates to some extent so that the arm both hooks onto the retaining component and strongly grasps that component. Conversely, rotation of the arm tending to unhook the arm from the retaining component is accompanied by translational movement outward, by which the arm can push the subrack away from the printed circuit board.

In particular, the present invention relates to a circuit module insertion/extraction mechanism including a latching mechanism adjacent a rear edge of the module, and an actuator adjacent a front edge of the module. Operation of the actuator in one direction moves a component of the latching mechanism in a first translational and rotational movement resulting in insertion of the module, and operation of the actuator in the other direction moves the component of the latching mechanism in a second translational and rotational movement resulting in extraction of the module.

The present invention further relates to a system for inserting, along a first axis, a plug-in module into a rack component so that at least a first connector on the plug-in module is coupled to at least a second connector on the rack component. The system includes a first arm that is positioned proximate a first edge of the plug-in module and that includes a first guiding surface. The system additionally includes an actuation device coupled to the plug-in module and capable of being actuated proximate a second edge of the plug-in module, and a second guiding surface on the plug-in module capable of interfacing with the first guiding surface. The actuation device causes the first arm to be translated inward with respect to the plug-in module when actuated in a first manner and causes the first arm to be translated outward when actuated in a second manner. As the first arm is moved inward, the first and second guiding surfaces interact so as to provide additional movement of the first arm and thereby engage a retaining component on the rack component.

DETAILED DESCRIPTION OF THE INVENTION

Figure 1:
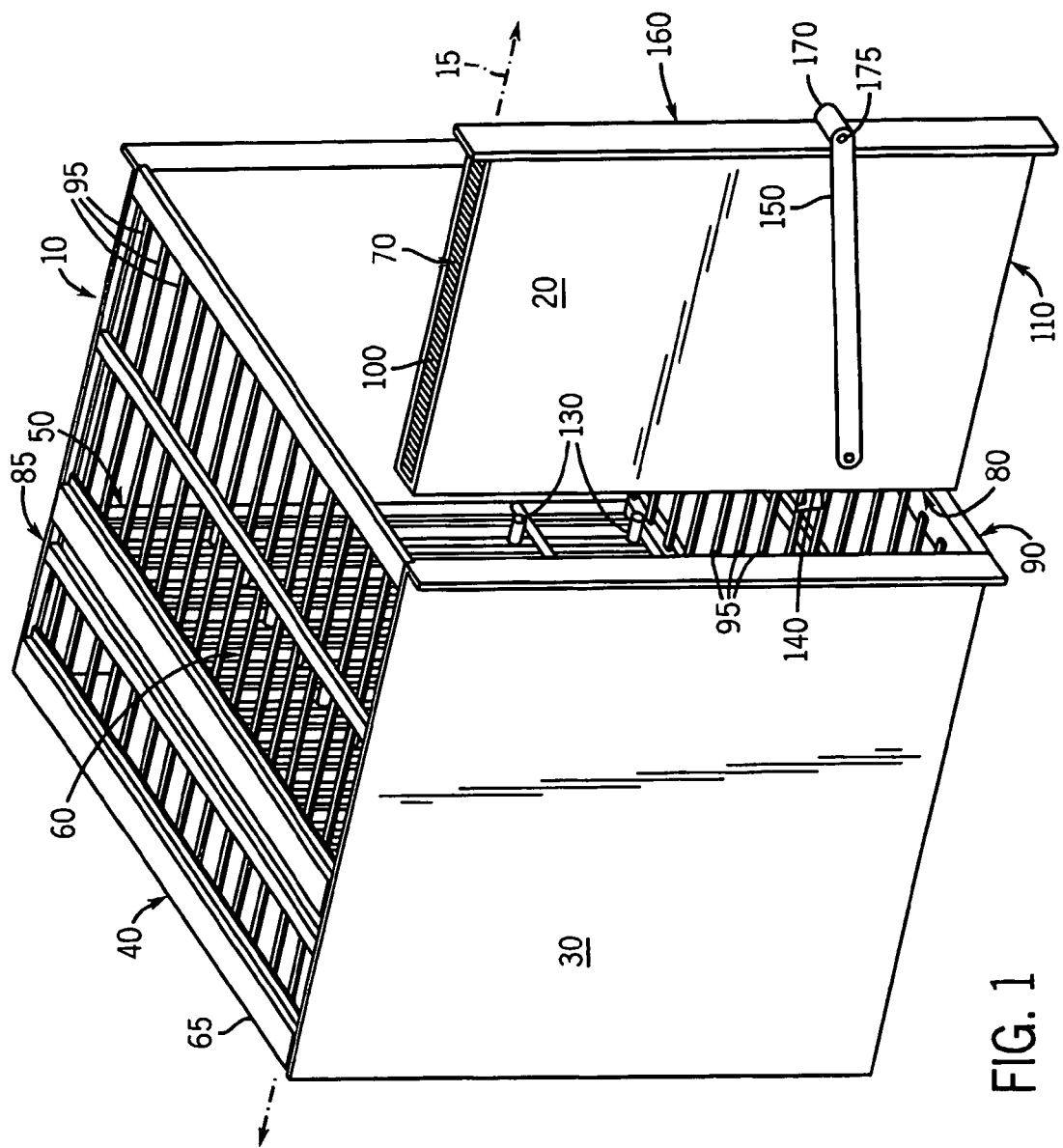
FIG. 1 is a perspective view of an exemplary subrack and plug-in module including a system for allowing insertion and extraction of the plug-in module with respect to the subrack, where the plug-in module is shown decoupled from the subrack.
Figure 2:
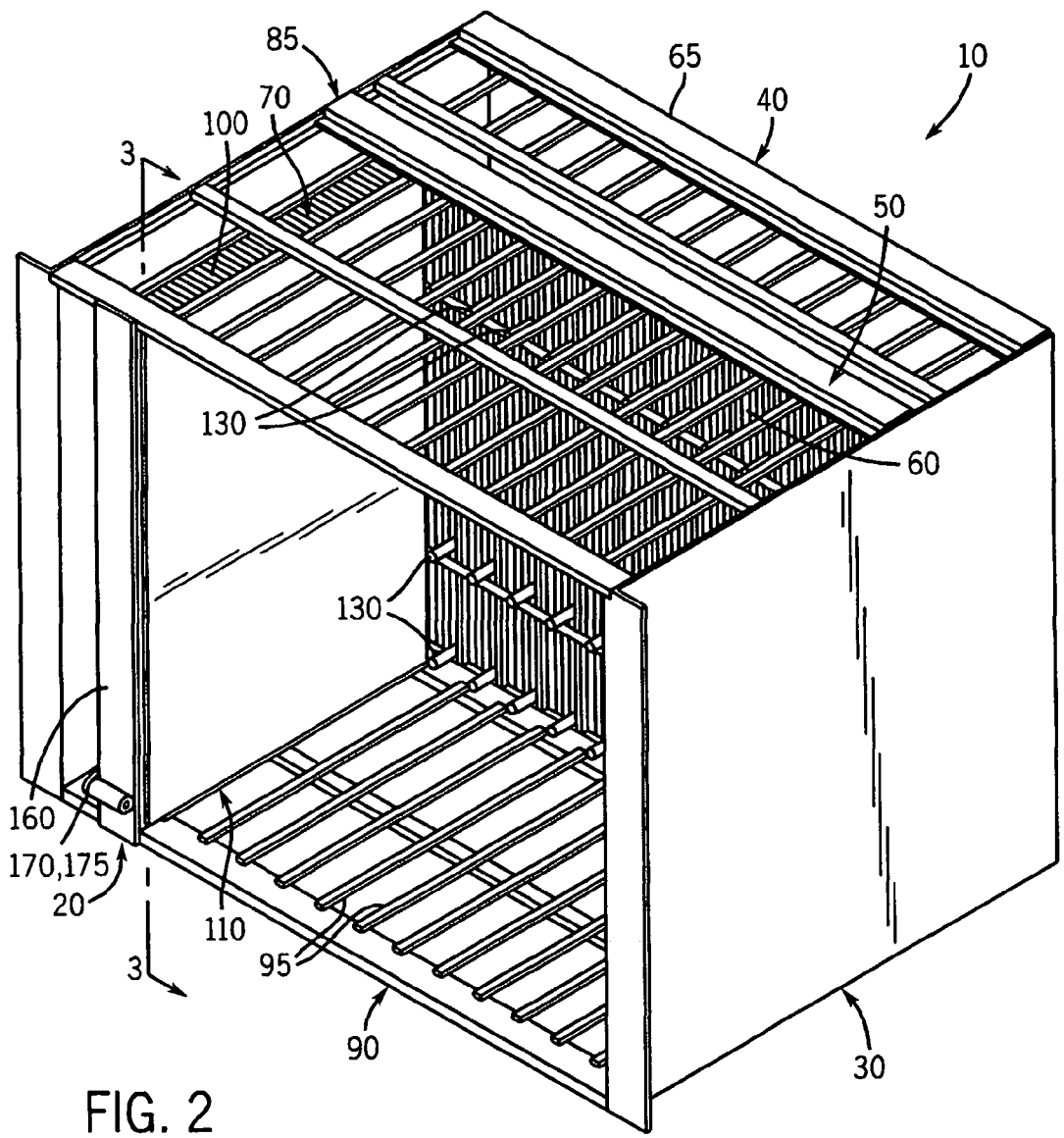
FIG. 2 is a perspective view of the subrack and plug-in module of FIG. 1, where the plug-in module is shown inserted into the subrack.

Referring to FIGS. 1 and 2, an exemplary subrack 10 is shown in conjunction with a plug-in module 20 that is capable of being inserted into and extracted from the subrack. More specifically, FIG. 1 shows the plug-in module 20 separated from the subrack 10, prior to its insertion into the subrack or after its extraction from the subrack, while FIG. 2 shows the plug-in module in its fully-inserted position within the subrack. In the embodiment shown, the subrack 10 includes walls 30 and other structural support components 40. In alternate embodiments, the subrack 10 can include subpartitions or other components not shown, and depending upon the embodiment also can form part of a larger rack or other piece of equipment.

The subrack 10 also includes a surface 50 on which are positioned connectors 60 that are connected to various other electrical components (not shown). The surface 50 in the present embodiment is a backplane, although in alternate embodiments it could be a different portion of the subrack 10. Also, in the present embodiment, the backplane 50 is actually not positioned at a rear 65 of the subrack 10, but rather is positioned somewhat forward of the rear in the middle of the subrack (and depending upon the embodiment could be located in other positions on the subrack).

The plug-in module 20, which in the present embodiment is approximately 1.2 inches thick and includes one or more printed circuit boards 70, also includes connectors 80 on the printed circuit boards. The connectors 80 of the printed circuit boards 70 are complementary with respect to the connectors 60 on the backplane 50, such that the connectors 60 and 80 are coupled to one another when the plug-in module 20 is inserted into the subrack 10. The subrack 10 and plug-in module 20 are exemplary of a wide variety of similar electronic equipment subracks and related components commonly used in computers, data processing and communications systems, and other devices. In the present embodiment, the subrack 10 is capable of receiving and being coupled to a plurality of other plug-in modules in addition to the plug-in module 20.

Figure 3:
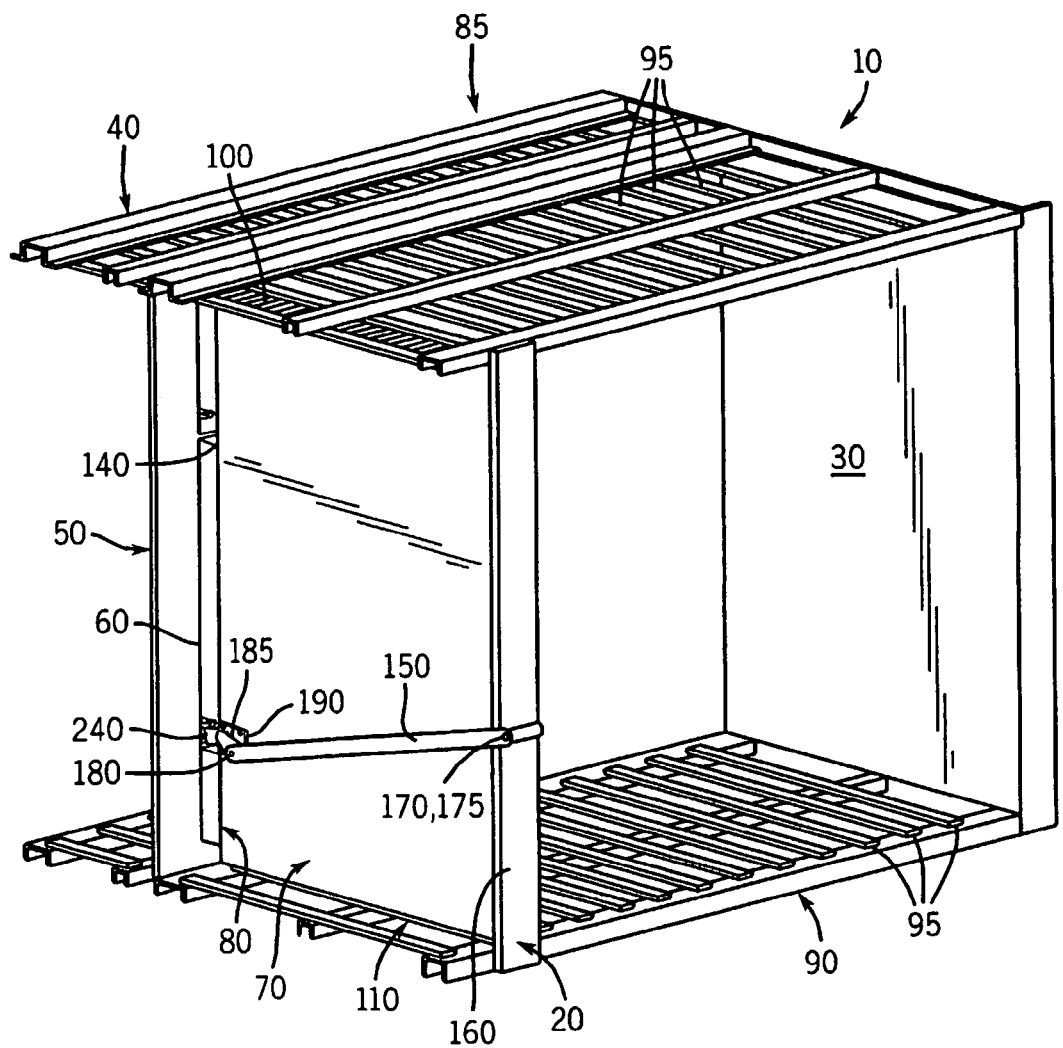
FIG. 3 is a perspective view of the subrack and plug-in module of FIG. 2 shown in cutaway (along line 3-3 of FIG. 2) to reveal components of the system allowing insertion and extraction of the plug-in module.

Further as shown in FIGS. 1, 2 and 3, the subrack 10 has along its top 85 and bottom 90 a plurality of guide rails 95. The guide rails 95 are capable of interfacing with complementary rails or ridges (not shown) along top and bottom edges 100,110 respectively, of the plug-in module 20. The guide rails 95 and complementary ridges of the plug-in module 20 allow for the plug-in module 20 to be generally aligned properly as it is inserted into the subrack 10. Specifically, for proper alignment and coupling of the connectors 60,80, the plug-in module 20 should be inserted into the subrack 10 along an alignment axis 15 that is, in the present embodiment, generally perpendicular to the backplane 50 (see FIG. 1).

The backplane 50 of the subrack 10 in the present embodiment additionally has three rows of pins 130. As the plug-in module 20 is inserted most of the way into the subrack 10, recesses (not shown) within a far edge 140 of the plug-in module receive the pins 130, such that the connectors 80 of the plug-in module are specifically aligned for coupling with the connectors 60. In alternate embodiments, a different number of rows of pins 130 could be employed in place of the three rows shown, and also the pins 130 could be positioned on the plug-in module 20 with the complementary recesses being positioned on the backplane 50.

The insertion and extraction processes of the plug-in module 20 with respect to the backplane 50 can be understood to include the insertion of the plug-in module along the guide rails 95 up to the point at which the connectors 60 and 80 begin to come into contact with one another, and also the extraction of the plug-in module once the connectors 60 and 80 have been disengaged from one another. These functions can be performed manually or by other mechanisms. However, the insertion and extraction processes in particular relate to applying the large forces required to fully insert and extract the plug-in module 20 when the connectors 60 are in contact with the connectors 80.

Figure 4:
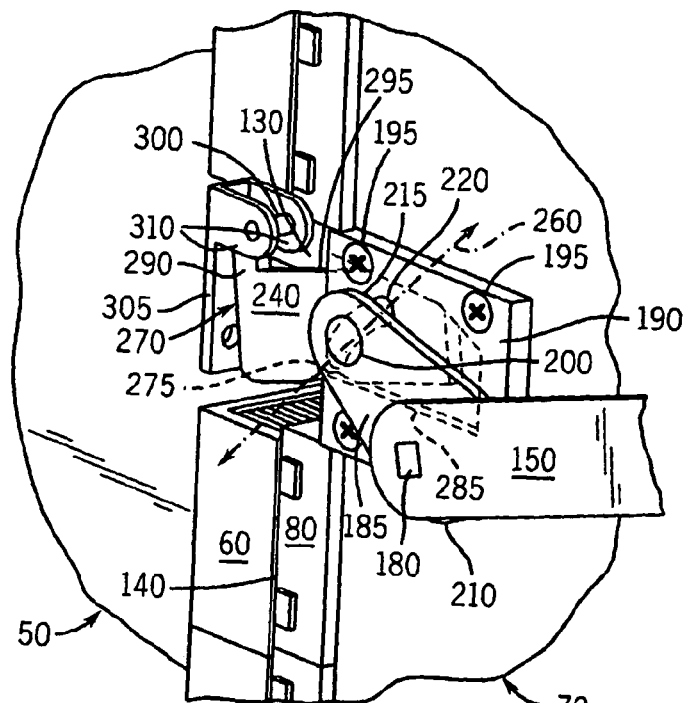
FIG. 4 is a perspective, enlarged view of some of the components shown in FIG. 3.
Figure 5:
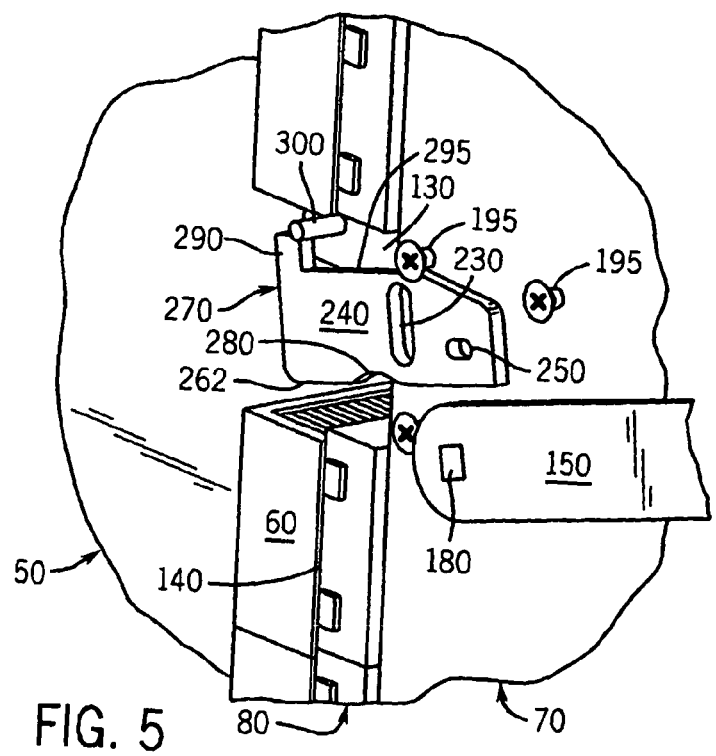
FIG. 5 is a perspective view of some of the components shown in FIG. 4, with some of the other components shown in FIG. 4 removed.

Referring particularly to FIGS. 3, 4 and 5, components of a system for applying these large forces required to insert and extract the plug-in module 20 with respect to the subrack 10 (and particularly the backplane 50) are shown. Included within this system is a lever 150 that extends nearly from the far edge 140 to a front edge 160 of the plug-in module. The lever 150, which is aluminum and has a cylindrical protuberance 170 at its front end 175 (to allow for grasping of the lever and/or to limit motion of the lever with respect to the front edge 160), pivots about an axis defined by a pivot pin 180 that protrudes through a drag link 185 and into a rectangular block 190 that is affixed to the plug-in module 20 and specifically, in this embodiment, to one of the printed circuit boards 70 of the plug-in module. In the present embodiment, the rectangular block 190 can be manufactured from aluminum or steel, while the drag link 185 is manufactured from sheet metal.

Also in the present embodiment, the rectangular block 190 is affixed to the printed circuit board 70 by way of a plurality of screws 195, although in alternate embodiments the rectangular block is affixed by way of another device or adhesive (or solder or welding). Indeed, the rectangular block 190, which is in part intended to provide extra support for the printed circuit board 70 to accommodate the forces being applied during the insertion/extraction processes, may not be necessary in certain embodiments where the printed circuit board is particularly strong. In such embodiments, the pivot pin 180 may directly extend into the printed circuit board itself.

The drag link 185 rotates in unison with the lever 150 as the lever is rotated about the axis defined by the pivot pin 180. In the present embodiment, the lever 150 and drag link 185 move in unison because the pivot pin 180, which is rounded where the pivot pin extends into the rectangular block 190 where it is axially captured, has a square shaped end that protrudes through corresponding square orifices within the lever and drag link. Consequently, all of the pivot pin, lever and drag link rotate together when the lever is rotated about the axis defined by the pivot pin 180.

As shown particularly in FIG. 4, while the pivot pin 180 protrudes through a first end 210 of the drag link 185, an additional pin 200 protrudes from a second end 215 of the drag link, through an arcing oblong orifice 220 (shown partly in phantom) within the rectangular block 190, and finally into a straight oblong orifice 230 within a pawl arm 240 (see FIG. 5). The pawl arm 240 in the present embodiment is made from sheet metal, is positioned between the rectangular block 190 and the printed circuit board 70, and includes a small orifice 250 that is optional.

Referring to FIGS. 4 and 5, the drag link 185 and arcing oblong orifice 220 are positioned such that, when movement of the lever 150 occurs, the movement of the additional pin 200 occurs predominantly along a dragging axis 260 that is an arc centered at the axis of pin 180 and is generally at an oblique angle relative to the far edge 140 of the plug-in module 20. Further, the positioning of the pawl arm 240 with its straight oblong orifice 230 is such that the straight oblong orifice 230 is predominantly oriented parallel to the far edge 140 as the pawl arm is guided in a recess of the block 190. Consequently, when the lever 150 is rotated downward and upward, respectively, the additional pin 200 moves upward and downward within the straight oblong orifice 230, respectively, and the movement of the additional pin 200 along the dragging axis 260 additionally forces the pawl arm 240 to move inward toward and outward away from the remainder of the plug-in module 20, respectively.

As shown particularly in FIG. 5, the pawl arm 240 additionally has a lower edge 262 that is predominantly flat near a far end 270 away from the plug-in module 20, but which has a concave indentation 280 as one follows the lower edge closer toward the plug-in module. While a portion of the pawl arm 240, including the far end 270, is not positioned between the rectangular block 190 and the printed circuit board 70, a portion of the lower edge 262 is positioned between the rectangular block and the printed circuit board and rests upon a flange or surface 285 of the recess in the block created along the bottom of the recess (or along a corresponding portion of the printed circuit board), which is shown in phantom in FIG. 4. The surface 285 thus provides support to the pawl arm 240 and prevents the pawl arm from rotating completely freely about the additional pin 200. It also creates a pivot point about which the arm 240 pivots into and out of a latched position, in which the arm is latched behind pin 300, as described below.

The pawl arm 240 includes a protrusion 290 extending from a higher edge 295 that is capable of hooking onto pin 300 extending parallel to the backplane 50 and supported by a pair of support arms 310 extending from a plate 305 that is attached to the backplane (by way of, for example, screws). The pin 300 and support arms 310 are in the present embodiment made from aluminum or other strong metal. The protrusion 290 pivots upward and hooks behind the pin 300 as the pawl arm 240 is forced inward toward the plug-in module 20 by moving handle 170 down, and moves downward away from the pin 300 as the pawl arm is forced outward away from the plug-in module by moving handle 170 up. This occurs because the lower edge 262 and particularly the concave indentation 280 of the pawl arm 240 interact with the surface 285 in a camlike manner when the pawl arm 240 is forced inward and outward by the additional pin 200. This movement of the pawl arm 240 due to the interaction of the lower edge 262 with the surface 285 can include both vertical and/or rotational movement with respect to the pin 200 (or at least with respect to a nonrotating axis defined by the pin in the case where the pin itself can rotate).

Specifically, when the pawl arm 240 is positioned outward away from the plug-in module 20, the concave indentation 280 portion of the lower edge 262 rests upon a rearward edge 275 of the surface 285 of the block 190. Then, when the pawl arm 240 is forced inward, the flat portion of the lower edge 262 moves in between the rectangular block 190 and the printed circuit board 70 such that the pawl arm 240 is forced relatively upward as the rearward edge 275 (or more) of the surface 285 interfaces the flat portion of the lower edge. Again, when the pawl arm 240 is again forced outward, the concave indentation 280 again rests upon the rearward edge 275 of the surface 285 and the pawl arm 240 moves relatively downward.

Given this design of the lever 150, the drag link 185, the rectangular block 190, the pawl arm 240, and the pin 300, the plug-in module 20 can be easily inserted and extracted with respect to the backplane 50, despite the large forces that must be applied to couple and decouple connectors 60 and 80. The insertion process occurs as follows, once the plug-in module 20 has been inserted along guide rails 95 and the pins 130 so that the connectors 60 and 80 are in close proximity.

Specifically, when the lever 150 is rotated downward about the axis of the pivot pin 180, the drag link 185 rotates upward such that the additional pin 200 of the drag link 185 pulls the pawl arm 240 inward toward the plug-in module 20. As the pawl arm 240 is pulled inward, the pawl arm also moves relatively upward due to the flat portion of the lower edge 262 interfacing the surface 285, and consequently the protrusion 290 moves upward and behind the pin 300. As the protrusion 290 interfaces the pin 300, the plug-in module 20 is pulled toward the backplane 50 such that the connectors 60 and 80 engage one another. When the lever 150 is fully rotated downward and the pawl arm 240 is fully pulled-in, the plug-in module 20 is fully inserted and the connectors 60 and 80 are fully coupled.

Conversely, when the lever 150 is rotated upward about the axis of the pivot pin 180, the drag link 185 rotates downward such that the additional pin 200 of the drag link 185 pushes the pawl arm 240 outward away from the plug-in module 20. As the pawl arm 240 is pushed outward, the pawl arm also moves relatively downward as the concave indentation 280 interfaces the surface 285, and consequently the protrusion 290 moves downward and away from the pin 300. Further, as the pawl arm 240 continues to be pushed outward, the far end 270 particularly along the protrusion 290 encounters the front surface of the plate 305 from which the arms 310 extend and thereby pushes the backplane away from the plug-in module. Thus, the rotation of the lever 150 forces the connectors 60 and 80 to be disengaged. Once the connectors 60 and 80 are disengaged, the plug-in module 20 can be pulled out of the subrack 10 away from the pins 130 and along the guide rails 95, and thus the plug-in module is fully extracted.

Figure 6:
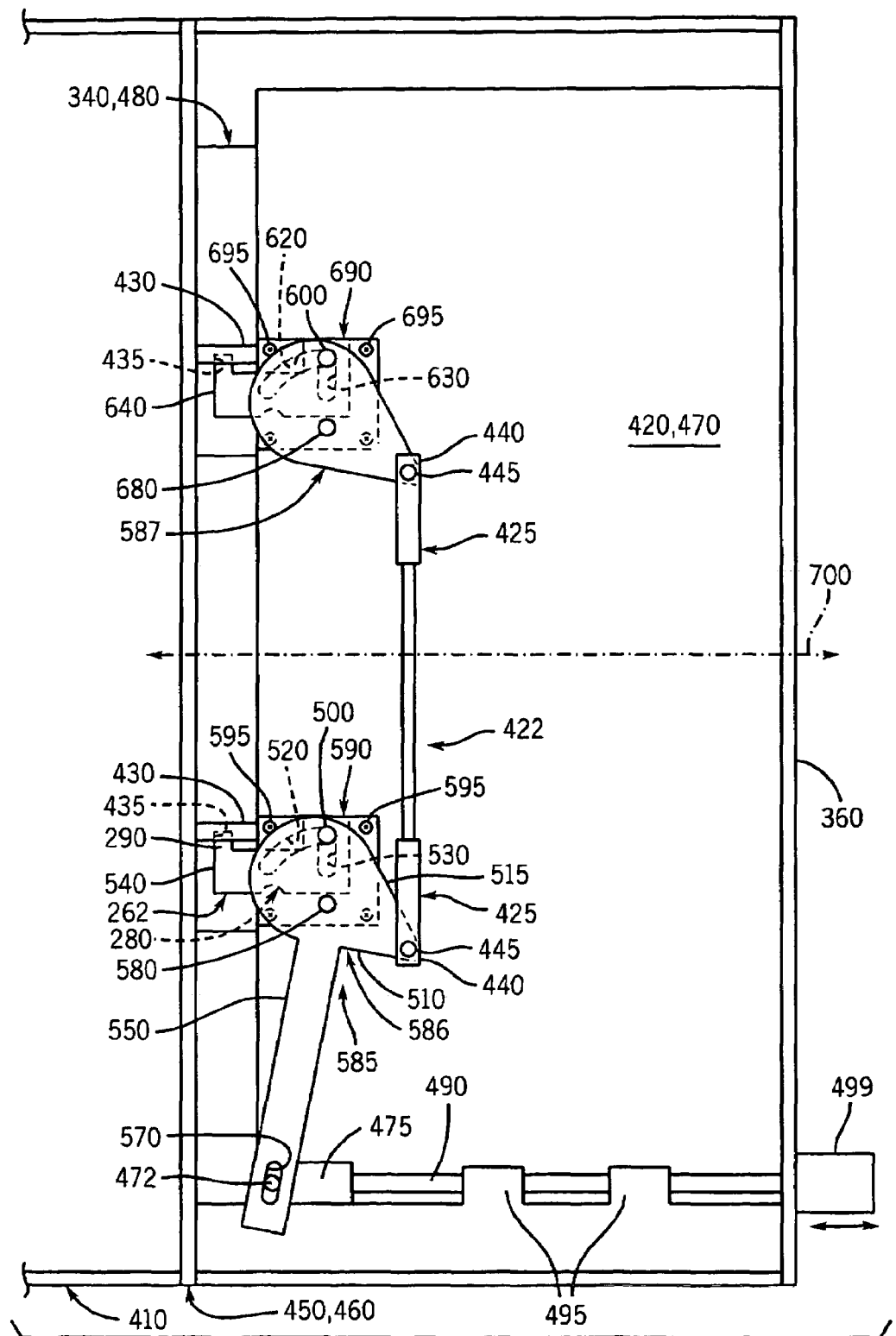
FIG. 6 is a side elevation view showing a cross-section of a subrack and additionally showing a plug-in module including another embodiment of a system allowing insertion and extraction of the plug-in module.

Turning to FIG. 6, a side elevation view is provided of another embodiment of a plug-in module 420, which is shown to be inserted into another embodiment of a subrack 410 (a cross-section of which is shown). As shown, the components employed for inserting and extracting the plug-in module 420 are somewhat different than those shown with reference to FIGS. 1-5. Specifically, the plug-in module 420 in this embodiment includes a push-pull rod 490 supported proximate the bottom of the plug-in module 420 by supports 495 on the plug-in module. The push-pull rod 490 includes a knob 499 located along a front edge 360 of the plug-in module 420. By pushing and pulling the knob 499, an operator can push the rod 490 generally toward, and pull the rod generally away from, connectors 480 on the plug-in module 420 along a far edge 340 of the plug-in module.

Mounted on a rod end 475 opposite the knob 499 is a pin 472 that fits within a slot 570 within a lever 550. The lever 550 is part of a larger drag link component 585 that includes not only the lever but also an eccentric drag link 586. The drag link component 585 is supported by and rotates about a pivot pin 580 proximate a first side 510 of the eccentric drag link 586. The pivot pin 580 is supported by a rectangular block 590, which in turn is coupled to a printed circuit board 470 of the plug-in module by one or more bolts/screws 595. Thus, as the push-pull rod 490 is pulled toward and away from the connectors 480, respectively, the lever 550 and drag link component 585 also are rotated toward and away from the connectors about the pivot pin 580. The coupling of the rod 490 with the lever 550 by way of the pin 472 and slot 570 make it possible for the rod to freely move back and forth despite a changing distance between the pin 472 and the pivot pin 580 during such movement.

Similar to the drag link 185 of FIGS. 3-4, the eccentric drag link 586 includes an additional pin 500, which is proximate a second side 515 of the eccentric drag link, and which protrudes through both an arcing oblong orifice 520 within the rectangular block 590 and through a straight oblong orifice 530 of a pawl arm 540. The pawl arm 540 is nearly identical to the pawl arm 240 of FIGS. 3-5 and, in particular, includes the protrusion 290, lower edge 262 and concave indentation 280 of the pawl arm 240. However, the straight oblong orifice 530 of the pawl arm 540 is somewhat longer than the corresponding orifice 230 of the pawl arm 240, and consequently the pawl arm 540 is somewhat wider proximate the straight oblong orifice 530 (to contain the orifice) than is the pawl arm 240 proximate its orifice 230. Likewise, the arcing oblong orifice 520 is somewhat longer in its arc than the arcing oblong orifice 220. The longer arcing oblong orifice 520 and straight oblong orifice 530 enable a somewhat greater range of motion for the pawl arm 240 than is enabled by the orifices 220 and 230; in any event, the exact lengths of these orifices is largely a matter of design choice.

As shown, when the plug-in module 420 is fully inserted with respect to the subrack 410, the connectors 480 of the plug-in module are fully coupled to complementary connectors 460 of a backplane 450 of the subrack. In contrast to the embodiment of FIGS. 4-5, in this embodiment the protrusion 290 of the pawl arm 540 fits within a notch 435 (shown in phantom) within an alignment pin 430 protruding from the backplane 450 rather than behind the pin 300. Otherwise, the operation of the pawl arm 540 in causing insertion/extraction of the plug-in module 420 in response to movement of the eccentric drag link 586 is identical to that of the pawl arm 240 (aside from the greater range of movement of the pawl arm 540). In particular, the pawl arm 540 rotates (or otherwise moves) downward about the additional pin 500 during extraction as the concave indentation 280 encounters a bottom of the recess within the rectangular block 590 (e.g., see FIG. 4), and rotates (or otherwise moves) upward about the additional pin during insertion as the flat portion of the lower edge 262 encounters the bottom of the recess.

In certain embodiments, multiple pawl arms can be actuated in response to the actuation, by an operator, of only a single device such as the knob 499/push-pull rod 490 or the handle 170/lever 150. With reference in particular to FIG. 6, in one embodiment, a second drag link component 587 is coupled to the first drag link component 585 by way of a connector rod 422. The second drag link component 587, which is identical in shape to the eccentric drag link 586 portion of the first drag link component 585, similarly rotates about a corresponding pivot pin 680 that is supported by a corresponding rectangular block 690, which in turn is coupled to the printed circuit board 470 by way of corresponding bolts/screws 695.

Upper and lower ends 425 of the connector rod 422 include respective pins 445 by which the respective ends are coupled to respective eccentric ends 440 of the respective drag link components 585,587. Consequently, when the first drag link component 585 is rotated due to operation of the push-pull rod 490 and the lever 550, the second drag link component 587 is rotated as well. Rotation of the second drag link component 587 similarly produces movement of an additional pin 600 through an additional arcing oblong orifice 620 of the rectangular block 690 and through an additional straight oblong orifice 630 of an additional pawl arm 640, which is identical to the pawl arm 540 and during insertion of the plug-in module 420 latches into a corresponding notch 435 of a corresponding alignment pin 430.

The systems shown in FIGS. 1-6 for inserting and extracting the plug-in modules 20,420 with respect to the subracks 10,410 are advantageous in several respects in comparison with conventional systems. First, the large forces required to fully couple and decouple the connectors 60,460 and 80,480 are applied proximate the far edges 140,340 of the plug-in modules 20,420 and the backplanes 50,450 themselves rather than at the front edges 160,360 of the plug-in modules or the front edges of the subracks 10,410. Consequently, large forces are not transferred through the plug-in modules 20,420 from the front edges 160,360 to the far edges 140,340, nor are large forces transferred from the front edges of the subracks 10,410 to the backplanes 50,450.

In particular, the large forces occur at the coupling interfaces of the connectors 60,460 and 80,480 themselves. Also, large forces occur at the interfaces between protrusions 290 and the pins 300,430, between the protrusions and the front sides of the backplanes 50,450 (when disengaging), and at the interfaces between the pivot pins 180,580,680 and the rectangular blocks 190,590,690. Because the rectangular blocks 190,590,690 are themselves affixed to the printed circuit boards 70,470 by way of several screws 195,595,695, the forces applied to the rectangular blocks are distributed over portions of the printed circuit boards, thus reducing the strain on the printed circuit boards.

Further, because the systems convert large distances of rotation of the front end 175 of the lever 150 (which is almost the full length of the printed circuit board 70), or large distances of translation of the push/pull rod 490 (which rotates the lever 550 that again is fairly long), into relatively small amounts of movement of the pawl arms 240,540,640, only relatively small amounts of force are required from an operator in order to apply the large forces required to couple and decouple the connectors 60,460,80,480. That is, the systems with the levers 150,550 provide large mechanical advantages.

A variety of alternate embodiments of the systems shown in FIGS. 1-6 are possible that also provide all or some of the same advantages as those systems. For example, in one alternate embodiment, the drag link 185 employed in the system of FIGS. 1-5 is not necessary. Instead of the drag link 185 and its additional pin 200, the lever 150 instead could itself include an additional pin that is offset from the pivot pin 180 by a certain distance toward the front edge 160. Additionally, in such an embodiment, the rectangular block 190 could be modified to have a different arcing oblong orifice (positioned closer toward the front edge 160 than the pivot pin 180 and having an axis that is either approximately perpendicular or approximately parallel to the axis 260), and the pawl arm 240 could be extended so that the straight oblong axis 230 received the additional pin. In such an embodiment, movement of the lever 150 from either an up position or a down position to an approximately horizontal position would tend to force the pawl arm 240 inwards, thus inserting the plug-in module, while movement of the lever from the horizontal position would tend to force the pawl arm outwards, thus extracting the plug-in module.

Further, in another alternate embodiment, different devices for imparting rotary motion to the drag links 185,586 can be employed instead of the lever 150 or the combination of the push-pull rod 490 and the lever 550 (including motorized, or hydraulic/pneumatic actuation devices). As discussed above, a single device such as the push-pull rod 490 (or the lever 150 of FIGS. 1-5) can be used to actuate multiple drag links and pawl arms (or other attachment devices) on a plug-in module to engage the backplane, so long as those drag links and pawl arms (or other attachment devices) are appropriately coupled to one another.

Likewise, multiple levers 150, push-pull rods 490, etc. could be included on a given plug-in module to independently actuate individual drag links and pawl arms (or other attachment devices) or sets of such components. For example, with reference to FIG. 6, the connecting rod 422 (and ends 425 and pins 445) could be removed and the components 587 and 600-695 could be replaced with a mirror image of the components shown below an axis 700 (that is, an additional push/pull rod, drag link component with lever, rectangular block and pawl arm could be implemented above the axis 700 in relation to an additional alignment pin). Combinations of different actuation mechanisms on a single plug-in module also are possible.

Also, in alternate embodiments, the relative positioning of the drag links, and of the pawl arms between the rectangular blocks and the printed circuit boards, can be varied. For example, the drag link could be on one side of the printed circuit board while the rectangular block and pawl arm were on the opposite side of the printed circuit board. Also, the drag link and rectangular block could be on one side of the printed circuit board, while the pawl arm could be located on the opposite side of the printed circuit board (with a protrusion extending from that side of the printed circuit board to interface the lower edge/concave indentation of the pawl arm). Further for example, in another alternate embodiment, the pawl arm, drag link and lever each could be positioned between the rectangular block and the printed circuit board. Or each of the pawl arm, the drag link and the lever could be positioned adjacent to the rectangular block (but not adjacent to the printed circuit board). Likewise, the relative positioning of the levers 150,550 and/or push-pull rod 490 can be varied.

Further, instead of guiding the positioning of the pawl arms 240,540,640 by way of the lower edges 262 with their concave indentations 280, different guiding structures could be employed. For example, with respect to FIGS. 1-5, an additional arcing oblong orifice that arced downward as one approached the far edge 270 could be provided in the pawl arm 240. A stationary screw or other pin between the rectangular block 190 and the printed circuit board 70 could extend through the additional arcing oblong orifice such that, as the pawl arm 240 was forced inward and outward, the interaction between the stationary screw and the arcing oblong orifice would force the pawl arm relatively upward and downward. Additionally, the protrusion 290 of the pawl arm 240 and the pin 300 could be essentially reversed so that a pin on the pawl arm interfaced with a protrusion extending from the backplane 50. Also, instead of using the pin 300 supported by the arms 310 (or the notch 435 within the alignment pin 430) a different slot-type component could be provided along the backplane 50 to receive the protrusion 290. The materials used to construct the various components of the system can be varied from those discussed above.

It is also presently envisioned that the present systems for inserting and extracting plug-in modules into subracks could include additional features. The systems can be designed for use with a wide variety of different types of racks, subracks, backplanes and other devices. Also, a keying device could be included that prevented the insertion of plug-in modules that were not appropriate for the particular subrack or slot (e.g., where the electrical connectors on the subrack or slot and plug-in modules were incompatible). The keying device could be included as part of the rectangular blocks 190,590, 690 or as another part of the latching mechanism. The present system can also be used for transition modules rather than plug-in modules. That is, the present system can be used for a variety of different types of modules that plug into a backplane or other rack component along the front side of the backplane or along the back side of the backplane, or both. Such modules can include modules that directly hook into one another without an intermediate backplane.

Additionally, the connection of the plug-in modules 20,420 with the backplanes 50,450 by way of the interfaces between the protrusion 290 and the pins 300,430 can provide grounding of the plug-in modules. Further, the coupling of connectors other than electrical connectors, e.g., optical connectors, fluid connectors and high-pressure air connectors, can be achieved using the present system. Also, the insertion and extraction process can be performed either manually or automatically, including by way of electrical motors or pneumatic or hydraulic devices. The positioning of the components of the system can be at any convenient locations along the far edges 140,340 of the plug-in modules 20,420 and the backplanes 50,450.

It will occur to those that practice the art that many modifications may be made without departing from the spirit and scope of the invention. In order to apprise the public of the various embodiments that may fall within the scope of the invention, the following claims are made:

What is claimed is:

1. A system for inserting, along a first axis, a plug-in module into a rack component so that at least a first connector on the plug-in module is coupled to at least a second connector on the rack component, the system comprising:
   a first arm that is positioned proximate a first edge of the plug-in module and that includes a first guiding surface;
   an actuation device coupled to the plug-in module and capable of being actuated proximate a second edge of the plug-in module; and
   a second guiding surface on the plug-in module capable of interfacing with the first guiding surface;
   wherein the actuation device causes the first arm to be translated inward with respect to the plug-in module when actuated in a first manner and causes the first arm to be translated outward when actuated in a second manner, and
   wherein, as the first arm is moved inward, the first and second guiding surfaces interact so as to provide additional movement of the first arm and thereby engage a retaining component on the rack component;
   wherein the actuation device includes: a first rotating component coupled to the plug-in module by a first pin, wherein the first rotating component is pivotable about the first pin; and
   a second pin positioned on the first rotating component a first distance from the first pin so that, as the first rotating component rotates about the first pin, the second pin moves in an arcuate manner that includes a first motion component that is substantially parallel to the first axis; and
   wherein the first arm includes a first orifice capable of receiving the second pin so that, as the first rotating component is rotated in a first direction, the second pin forces the first arm inward toward the plug-in module.

2. The system of claim 1, wherein the first rotating component is a drag link component that includes a lever portion extending radially-outward away from the first pin, and wherein the actuation device further includes a push-pull rod extending from proximate the second edge to an outer end of the lever portion, to which the push-pull rod is hingedly coupled.

3. The system of claim 2, wherein the push-pull rod extends substantially parallel to the first axis and wherein, as the push-pull rod is pushed inward toward the first edge, the second pin on the drag link component is rotated and consequently the first arm is forced inward toward the plug-in module and additionally is rotated to hook onto the retaining component.

4. The system of claim 3, wherein the lever portion includes a slot and the push-pull rod includes an additional pin that is positioned within the slot.

5. The system of claim 3, further comprising:
   a second arm that is positioned proximate the first edge of the plug-in module and that includes a third guiding surface;
   a fourth guiding surface on the plug-in module capable of interfacing with the third guiding surface; and
   a second drag link component rotatably coupled to the plug-in module by a third pin and coupled additionally to the second arm by a fourth pin,
   wherein each of the first and second drag link components includes a respective eccentric portion, and
   wherein the respective eccentric portions of the first and second drag link components are linked to one another by a connector so that, when the first drag link component is rotated, the second drag link component also is rotated, which in turn causes movement of the second arm.

6. The system of claim 3, wherein the retaining component is an alignment pin protruding from the backplane and having a notch to receive a protrusion of the first arm.

7. The system of claim 3, wherein the system is further for extracting the plug-in module from the rack component, wherein, when the first arm is forced outward away from the plug-in module, pressure is applied by the first arm to the rack component, so that the rack component is forced away from the plug-in component.

8. The system of claim 7, wherein the lever portion creates a mechanical advantage in moving the first arm, and wherein the first guiding surface has a first portion that is substantially flat and a second portion that is substantially concave.

9. A system for inserting, along a first axis, a plug-in module into a rack component so that at least a first connector on the plug-in module is coupled to at least a second connector on the rack component, the system comprising:
- a first arm that is positioned proximate a first edge of the plug-in module and that includes a first guiding surface;
- an actuation device coupled to the plug-in module and capable of being actuated proximate a second edge of the plug-in module; and
- a second guiding surface on the plug-in module capable of interfacing with the first guiding surface;
- wherein the actuation device causes the first arm to be translated inward with respect to the plug-in module when actuated in a first manner and causes the first arm to be translated outward when actuated in a second manner, and
- wherein, as the first arm is moved inward, the first and second guiding surfaces interact so as to provide additional movement of the first arm and thereby engage a retaining component on the rack component;
- wherein the actuation device includes a second arm coupled to the plug-in module by a first pin, wherein the second arm is pivotable about the first pin, wherein the second arm extends a majority of a first distance from the first edge of the plug-in module to the second edge of the plug-in module;
- wherein the actuation device further includes a second pin positioned a second distance from the first pin, wherein the second pin is mechanically coupled to the second arm so that, as the second arm rotates about the first pin, the second pin moves in an arcuate manner that includes a first motion component that is substantially parallel to the first axis; and
- wherein the first arm includes a first orifice capable of receiving the second pin, so that the first arm rotates about the second pin as the second arm is rotated.

10. The system of claim 9, further comprising a drag link arm having first and second ends, wherein the first pin extends through a first end of the drag link arm, wherein the drag link arm is rotationally coupled to the second arm so that, as the second arm rotates about the first pin, the drag link arm also rotates about the first pin, and wherein the second pin is supported at the second end of the drag link arm.

11. The system of claim 9, wherein the first orifice is an oblong orifice having a longer axis that is substantially perpendicular to the first axis.

12. The system of claim 9, wherein the retaining component is a third pin supported by at least one additional arm with respect to the remainder of the rack component, and wherein the third pin is substantially perpendicular to the first axis.

13. The system of claim 9, wherein the first arm includes a protrusion that engages the third pin when the first arm is forced to move translationally inward and to rotate upward.

14. The system of claim 9, wherein the first guiding surface has a first portion that is substantially flat and a second portion that is substantially concave, wherein the second portion interfaces with the second guiding surface before the first arm has been forced inward, and wherein the first portion interfaces with the second guiding surface as the first arm is forced inward, thereby causing the first arm to rotate towards the retaining component and engage the retaining component.

15. The system of claim 9, wherein the system is further for extracting the plug-in module from the rack component, wherein, when the first arm is forced outward away from the plug-in module, pressure is applied by the first arm to the rack component, so that the rack component is forced away from the plug-in component.

16. The system of claim 9, wherein the second arm acts as a lever arm and creates a mechanical advantage in moving the first arm.

* * * * *